(12) United States Patent
M. et al.

(10) Patent No.: US 11,810,633 B2
(45) Date of Patent: Nov. 7, 2023

(54) RECEIVER TRAINING OF REFERENCE VOLTAGE AND EQUALIZER COEFFICIENTS

(71) Applicant: Cadence Design Systems, Inc., San Jose, CA (US)

(72) Inventors: Ashwin S. M., Karnataka (IN); Anirudha Shelke, Karnataka (IN); Navin Kumar Mishra, Karnataka (IN); Phalguni Bala, Karnataka (IN); Younus Syed, Karnataka (IN); Kiran Baby, Karnataka (IN); Sudhir Kumar Katla Shetty, Karnataka (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/460,701

(22) Filed: Aug. 30, 2021

(65) Prior Publication Data

US 2022/0051742 A1 Feb. 17, 2022

Related U.S. Application Data

(63) Continuation of application No. 17/026,133, filed on Sep. 18, 2020, now Pat. No. 11,133,081.

(Continued)

(51) Int. Cl.
*G11C 7/10* (2006.01)
*G11C 29/36* (2006.01)
(Continued)

(52) U.S. Cl.
CPC ............... *G11C 29/36* (2013.01); *G11C 7/22* (2013.01); *G11C 29/50004* (2013.01); *G11C 2207/2254* (2013.01)

(58) Field of Classification Search
CPC . G11C 2207/2254; G11C 29/028; G11C 7/22; G11C 29/36; G11C 29/50004;
(Continued)

(56) References Cited

U.S. PATENT DOCUMENTS 8,861,583 B2 10/2014 Liu
9,620,184 B1 4/2017 Bialas, Jr. et al.
(Continued)

FOREIGN PATENT DOCUMENTS

KR 20190054909 * 5/2019 ............. G11C 5/147

*Primary Examiner* — Uyen Smet
(74) *Attorney, Agent, or Firm* — Mark Whittenberger, Esq.; Holland & Knight LLP

(57) ABSTRACT

In a receiver having at least a first equalizer and a sampler, a calibration module jointly calibrates a reference voltage and one or more equalizer coefficients. For each of a set of test reference voltages, an equalizer coefficient for the first equalizer may be learned that maximizes a right eye boundary of an eye diagram of a sampler input signal to a sampler of the receiver following the equalization stage. Then, from the possible pairs of reference voltages and corresponding optimal equalizer coefficients, a pair is identified that maximizes an eye width of the eye diagram. After setting the reference voltage, the first equalizer coefficient may then be adjusted together with learning a second equalizer coefficient for the second equalizer using a similar technique.

20 Claims, 7 Drawing Sheets

Related U.S. Application Data

(60) Provisional application No. 62/904,598, filed on Sep. 23, 2019.

(51) Int. Cl.
*G11C 7/22* (2006.01)
*G11C 29/50* (2006.01)

(58) Field of Classification Search
CPC . G11C 29/023; G11C 29/021; G11C 11/4074; G11C 11/4093
See application file for complete search history.

(56) References Cited

U.S. PATENT DOCUMENTS

| | | | |
|---|---|---|---|
| 2010/0329325 A1* | 12/2010 | Mobin | H04L 25/03343 375/232 |
| 2014/0269881 A1 | 9/2014 | He et al. | |
| 2018/0114564 A1* | 4/2018 | DeSimone | G11C 11/4072 |
| 2019/0113939 A1* | 4/2019 | Fang | G05F 1/46 |
| 2019/0386775 A1 | 12/2019 | Lee et al. | |
| 2020/0358590 A1* | 11/2020 | Kim | H04L 7/0087 |

* cited by examiner

Perform Receiver Pre-Calibration
302

Set DFE and CTLE Coefficients to Initial Values
502

Calibrate Vref Based on Eye Width Criterion
504

Apply Pre-Adaption to DFE Coefficients
506

Perform Initial Levelization to Meet Latency Metric
508

Return DFE Coefficient to Initial Value
510

FIG. 5

RECEIVER TRAINING OF REFERENCE VOLTAGE AND EQUALIZER COEFFICIENTS

CROSS-REFERENCE TO RELATED APPLICATIONS

This application is a continuation of U.S. patent application Ser. No. 17/026,133 filed on Sep. 18, 2020 which claims the benefit of U.S. Provisional Application No. 62/904,598 filed on Sep. 23, 2019, each of which is incorporated by reference in its entirety.

BACKGROUND

In a receiver such as a single-ended receiver used in dynamic random access memory (DRAM) devices, proper calibration of a reference voltage and equalizer coefficients is desirable to ensure robust operation. However, a challenge exists in accurately and efficiently calibrating multiple parameters in a manner that optimizes overall operation of the receiver.

BRIEF DESCRIPTION OF THE DRAWINGS

The teachings of the embodiments herein can be readily understood by considering the following detailed description in conjunction with the accompanying drawings.

FIG. 5 is a flowchart illustrating an example embodiment of a process for performing a pre-calibration of a receiver.

DETAILED DESCRIPTION OF EMBODIMENTS

In a receiver having at least a first equalizer (e.g., a decision feedback equalizer (DFE)), and a sampler that samples a sampler input signal generated from the first equalizer, a calibration module jointly calibrates a reference voltage of the receiver and one or more equalizer coefficients by learning parameters that optimize one or more calibration criteria. In a particular embodiment, for each of a set of test reference voltages, an equalizer coefficient for the first equalizer may be learned that maximizes a first optimization criterion associated with a first signal parameter. The first signal parameter may be related to timings of the crossings of sampler input signal with a threshold voltage. For example, the first optimization criterion may comprise maximizing a right eye boundary of an eye diagram of a sampler input signal. Then, from the possible pairs of reference voltages and corresponding optimal equalizer coefficients, a pair is identified that maximizes a second optimization criterion associated with a second parameter, which may also relate to timings of the crossings of the sampler input signal. For example, the second optimization criterion may comprise maximizing an eye width of the eye diagram.

In embodiments including a second equalizer (e.g., a continuous time linear equalizer (CTLE)), the first equalizer coefficient may be further adjusted together with learning a second equalizer coefficient for the second equalizer. Here, the calibration module may identify, for each of a set of test second equalizer coefficients, the first equalizer coefficient that maximizes the first optimization criterion (e.g., maximizing the right eye boundary of the eye diagram of a sampler input signal), and then select from the possible pairs of first and second equalizer coefficients, a pair that maximizes the second optimization criterion (e.g., maximizing the eye width of the eye diagram).

Figure 1:
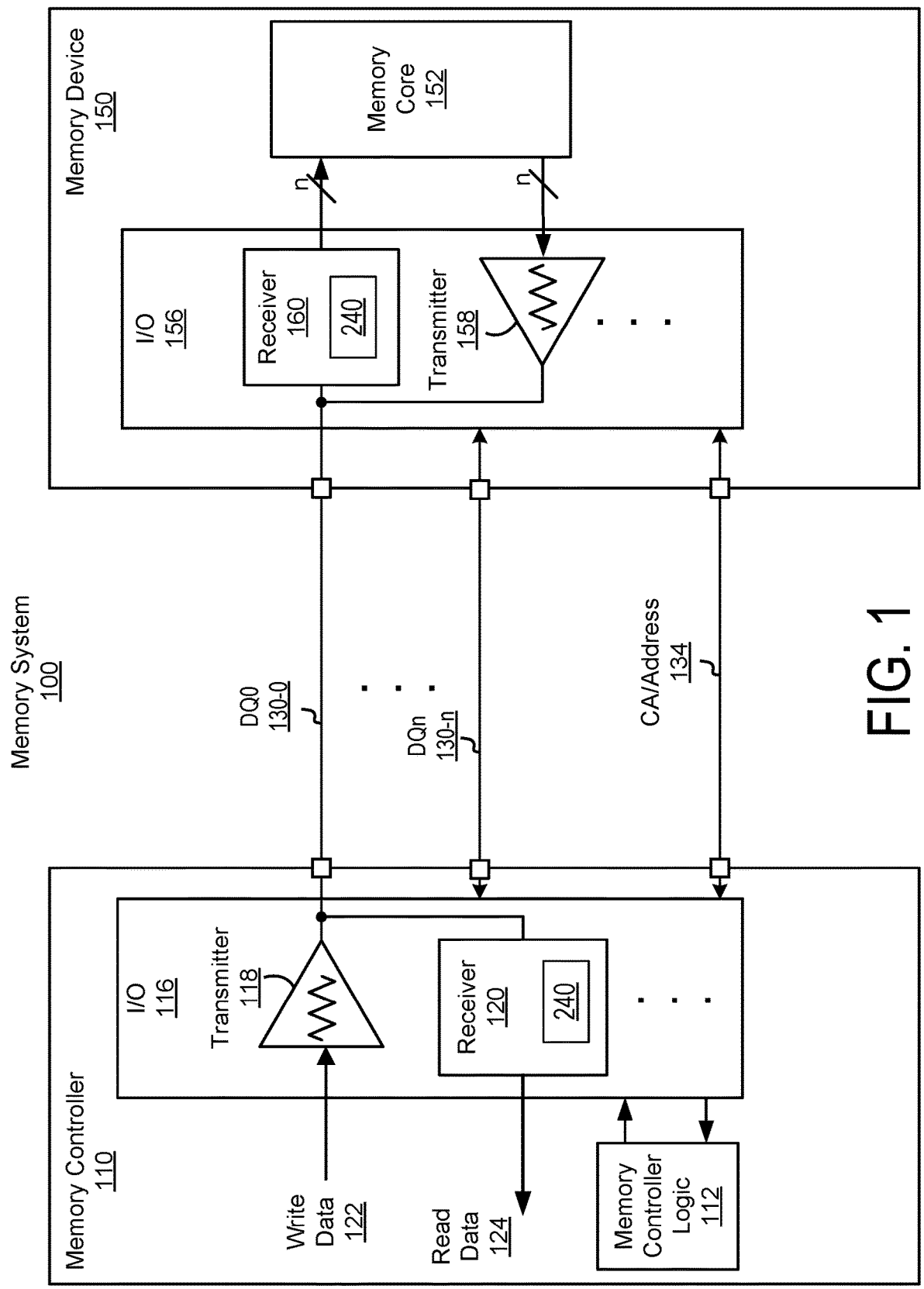
FIG. 1 is a block diagram illustrating an example embodiment of a memory system.

FIG. 1 illustrates an embodiment of a memory system 100 comprising a memory controller 110 coupled to a memory device 150. The memory controller 110 and the memory device 150 communicate via a plurality of communication links including data lines DQ0 through DQn 130 and command/address line 134. Some embodiments may include additional communication links not illustrated in FIG. 1. In one embodiment, the communication links 130, 134 use signal-ended signaling.

The memory device 150 may be a DRAM (dynamic random access memory), SRAM (static random access memory), a non-volatile memory such as a flash memory, or any other type of memory device. The memory device 150 includes a memory core 152 and an input/output device 156 including a transmitter 158 and a receiver 160. For simplicity of illustration, only a single transmitter 158 and receiver 160 are shown in the I/O 156 communicating via the communication link DQ0 130-0. In practice, the I/O 156 may have multiple transmitters 158 and receivers 160 for communicating over the other communication links (e.g., the data links DQ1-DQn and the CA/Address 134). Furthermore, in one embodiment, a multiplexing scheme may be used to allow a transmitter 158 and a receiver 160 to communicate over two or more different communication links.

The memory controller 110 comprises memory controller logic 112 and an input/output (I/O) circuit 116 including a transmitter 118 and a receiver 120. For simplicity of illustration, only a single transmitter 118 and receiver 120 are shown in the I/O 116 communicating over the communication link DQ0 130-0. In practice, the I/O 116 may have multiple transmitters 118 and receivers 120 for communicating over the other communication links (e.g., DQ1-DQn and CA/Address 134). Furthermore, in one embodiment, a multiplexing scheme may be used to allow the transmitter 118 and the receiver 120 to communicate over two or more different communication links.

The receivers 120, 160 include respective calibration modules 240 that jointly calibrate various parameters of the receivers 120,160 such as reference voltage and equalizer coefficients, as will be described in further detail below with respect to FIGS. 3-5.

The memory controller 110 and the memory device 150 may include additional components that are omitted from the FIG. 1 for simplicity of illustration. Furthermore, embodiments described herein in the context of the memory controller 110 transmitting data signals to the memory device 150 for write operations may similarly be used for transmission of data signals from the memory device 150 to the memory controller 110 for read operations and vice versa.

In one embodiment, the memory controller 110 and the memory device 150 may be implemented as separate dies within the same package. In other embodiments, they are implemented in their own respective packages.

The memory controller logic 112 generates various command/address signals (CA/Address) to transmit to the memory device 150 via the CA/Address link 134 to control the operation of memory device 150 and to read or write data from/to the memory device 150. For example, in a write operation, write data 122 is transmitted from the memory controller 110 to the memory device 150 via data lines DQ0-DQn 130 following a write command sent from memory controller 110 via the CA/Address link 134. In a read operation, read data 124 is transmitted from the memory device 150 to the memory controller 110 via data lines DQ0-DQn 130 following a read command sent from the memory controller 110 via CA/Address link 134.

The memory core 152 includes a number of memory cells that store write data received from the memory controller 110 and/or output read data for transmission to the memory controller 110 in response to applicable respective command/address signals received from the memory controller 110 via the CA/Address link 134.

Figure 2:
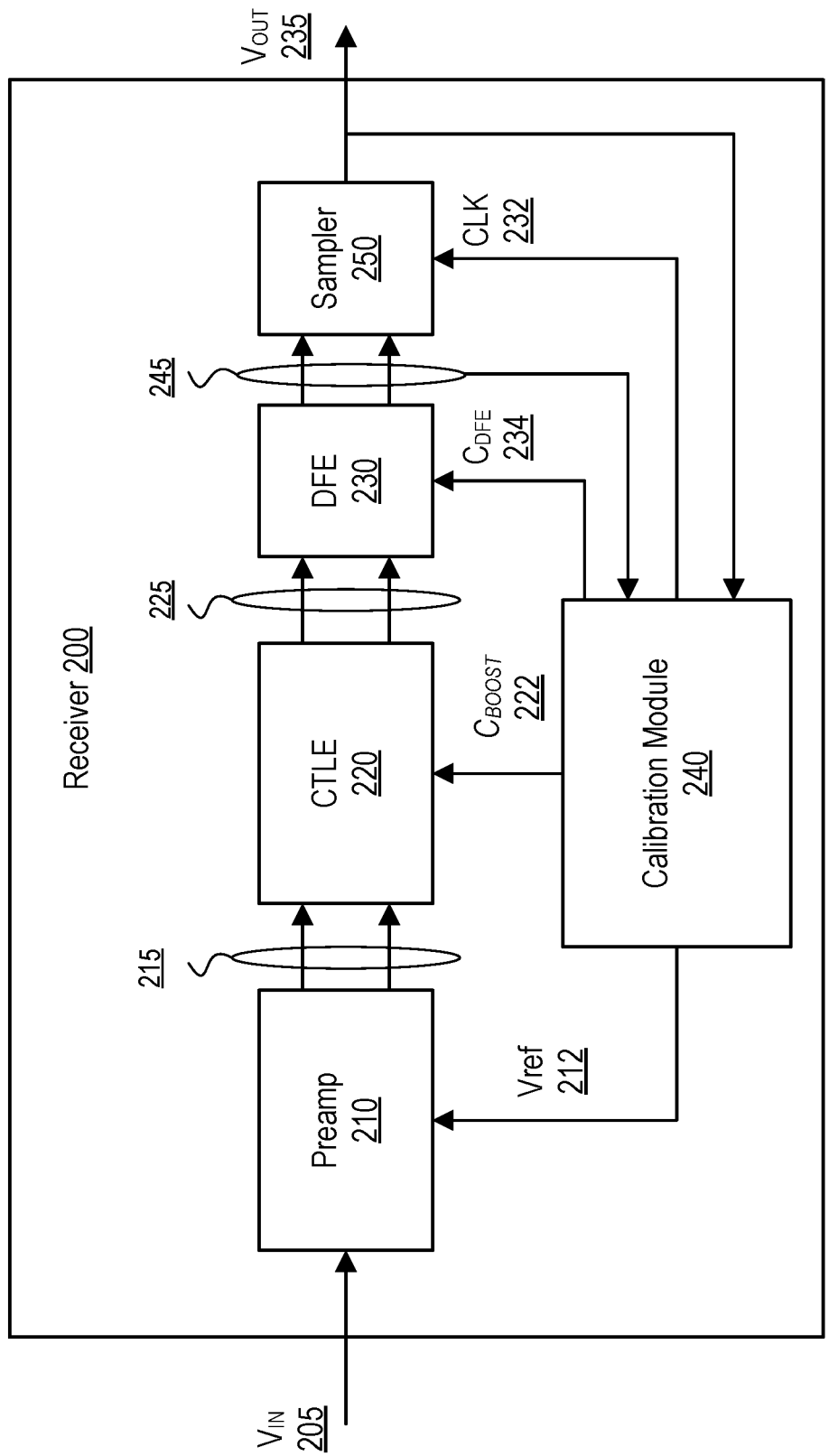
FIG. 2 is a block diagram illustrating a first example embodiment of a receiver.

FIG. 2 illustrates an example embodiment of a receiver 200. The receiver 200 may be utilized in the memory system 100 as the receiver 160 of the I/O device 156 of the memory device 150 or the receiver 120 of the I/O device 116 of the memory controller 110. For example, the receiver 200 may correspond to a receiver 120, 160 in either a memory controller 110 or a memory device 116 coupled to receive signals over any of the data lines DQ, the command/address line 134, or any other signal lines not expressly illustrated in FIG. 1. Alternatively, the receiver 200 may be utilized in a different communication system that is not necessarily a memory system 100.

In embodiment, the receiver 200 comprises a pre-amplifier 210, a continuous time linear equalization (CTLE) circuit 220, a decision feedback equalizer (DFE) 230, a sampler circuit 250, and a calibration module 240. In alternative embodiments, the receiver 200 may comprise different or additional components.

The pre-amplifier 210 receives an input signal ($V_{IN}$) 205 as a single-ended signal and generates a differential signal 215 based on a reference voltage ($V_{REF}$) 212. For example, the pre-amplifier 210 may generate a positive component of the differential signal 215 as $V_P=G^*(V_{IN}-V_{REF})$ and a negative component of the differential signal 215 as $V_N=G^*(V_{REF}-V_{IN})$ where G is a gain factor.

The CTLE circuit 220 equalizes the differential signal 215 based on a CTLE equalizer coefficient $C_{BOOST}$ 222 to generate a CTLE equalized differential signal 225 that has reduced inter-symbol interference (ISI) relative to the differential signal 215. The DFE circuit 230 then applies an additional equalization to the CTLE equalized differential signal 225 based on a DFE equalizer coefficient $C_{DFE}$ 234 and generates a sampler input signal 245. The sampler 250 samples the sampler input signal 245 according to a sampling clock (CLK) 232 to generate an output signal ($V_{OUT}$) 235 comprising a sequence of output samples.

The calibration module 240 calibrates the receiver 200 by determining appropriate values for $V_{REF}$ 212, $C_{BOOST}$ 222, and $C_{DFE}$ 234, and adjusting timing of the sampling clock 232 in a training process. For example, the calibration module 240 may calibrate the receiver 200 in a manner that results in low bit error rate in the output signal 235. In an embodiment, the calibration module 240 operates in a training mode while a predefined input signal pattern is transmitted to the receiver 200 as the input signal 205. The calibration module 240 monitors various parameters of the output signal 235 while adjusting $V_{REF}$ 212, $C_{BOOST}$ 222, and $C_{DFE}$ 234 to learn respective values that collectively enable the receiver 200 to achieve one or more optimization criteria. The calibration module 240 then configures the receiver 200 according to the learned values. An example of a training process is described in further detail below with respect to FIGS. 3-5.

In various embodiments, the calibration module 240 may be implemented as a circuit, in firmware, or in software. For example, in one embodiment, the calibration module comprises one or more processors and a non-transitory computer-readable storage medium that stores instructions executable by the one or more processors to perform the steps attributed to the calibration module 240 as described herein.

Figure 3:
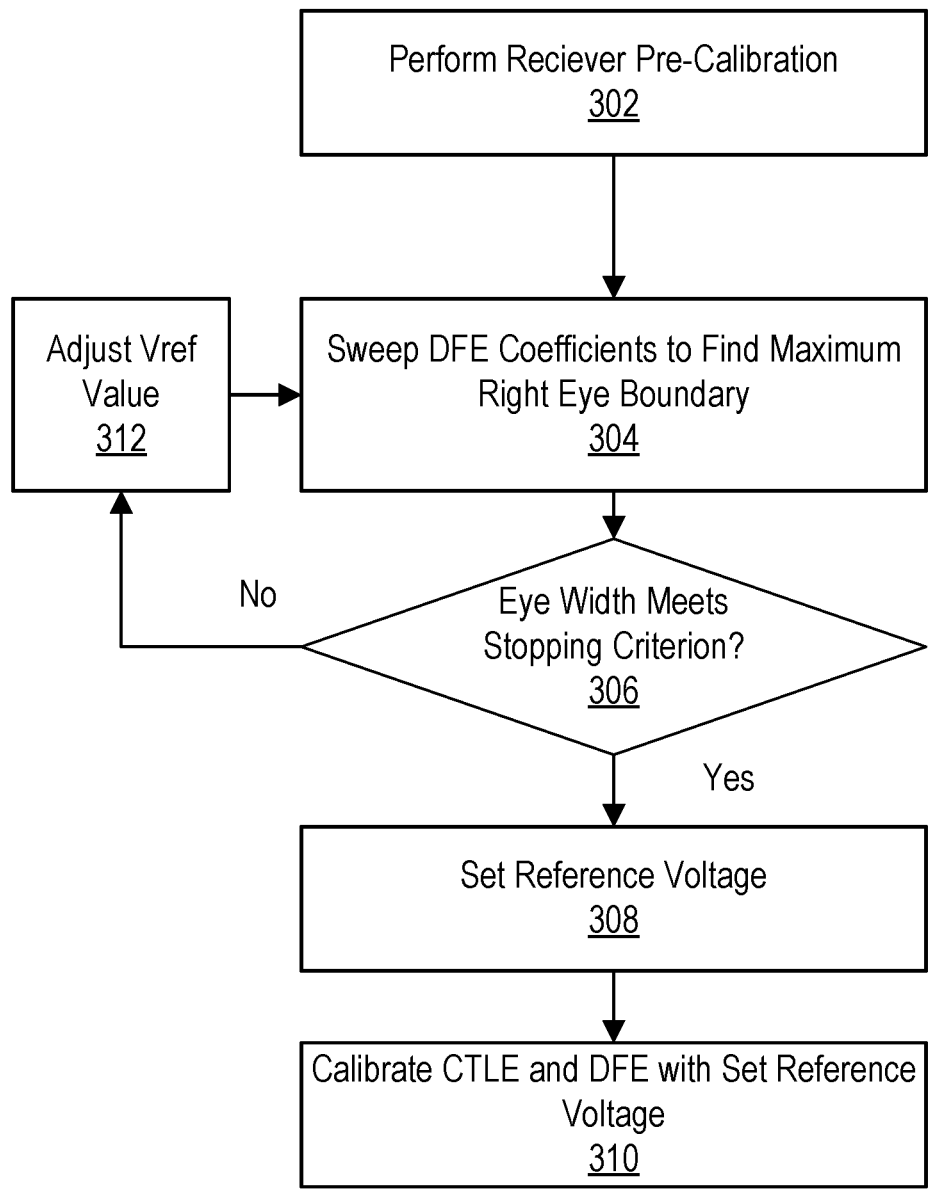
FIG. 3 is a flowchart illustrating an example embodiment of a process for jointly calibrating a reference voltage and a first equalizer coefficient of a receiver.

FIG. 3 illustrates an example embodiment of a training process that jointly learns a reference voltage $V_{REF}$ 212, a CTLE equalizer coefficient $C_{BOOST}$ 222, and a DFE equalizer coefficient $C_{DFE}$ 234. The calibration module 240 initially performs 302 a pre-calibration process that determines an initial value for $V_{REF}$ 212 and sets the $C_{BOOST}$ 222 and $C_{DFE}$ 234 to respective default starting values. In an embodiment, the default starting values are $C_{DFE}=0$ and $C_{BOOST}=1$. A process for performing 302 the pre-calibration is described in further detail in FIG. 5.

With $V_{REF}$ 212 and $C_{BOOST}$ 222 set to their initial values, a predefined input bit pattern is received as $V_{IN}$ and $C_{DFE}$ 234 is swept 304 across a range of values (e.g., increasing from $C_{DFE}=0$). During this sweep, the calibration module 240 identifies the value of $C_{DFE}$ 234 that maximizes a first optimization criterion associated with a first parameter. Here, the parameter may be computed based on timings of the crossings of the sampler input signal 245 with a threshold signal value. For example, maximizing the first optimization criterion may comprise maximizing a right eye boundary of an eye diagram associated with the sampler input signal 245. In one embodiment, the right eye boundary of an eye diagram is computed each time $C_{DFE}$ 234 is incremented. The right eye boundary will generally increase (i.e., occur later) with increasing $C_{DFE}$ 234 until a peak position of the right eye boundary is reached, at which point the right eye boundary will begin to decrease (i.e., occur earlier) with further increasing $C_{DFE}$ 234. Thus, once the right eye boundary position begins to decrease with further increasing $C_{DFE}$ 234, the sweep may be stopped and the peak value of $C_{DFE}$ 234 may be stored in association with the current value for $V_{REF}$, thus forming a $C_{DFE}/V_{REF}$ pair.

In an embodiment, the bit pattern received by the receiver 200 as $V_{IN}$ 205 during this sweep has a mix of AC bits (e.g., bits that are different than the respective previous bits) and DC bits (e.g., bits that are the same as the respective previous bits). For example, in an embodiment, the following training pattern is used: 1110 1100 1100 0100.

In an embodiment, the right boundary of the eye diagram at the sampler input 245 is computed by increasingly delaying a phase of the sampling clock 232 from a center position until at least one of the bits in the incoming bit pattern is sampled incorrectly by the sampler 250 resulting in a bit error in the output signal $V_{OUT}$ 235. The clock phase when this first error occurs is recorded as a measure of the right boundary of eye.

Once the value of $C_{DFE}$ 234 is detected that meets the first optimization criterion for the current $V_{REF}$ 212 and $C_{BOOST}$ 222, the calibration module 240 may determine a second parameter (e.g., an eye width of the eye diagram) measured when these values are applied and determine 306 if the eye width meets a stopping criterion. Here, the eye width as a difference between the right eye boundary found above and a left boundary of the eye. Here, to find the left boundary of the eye, the sampling clock phase of the sampling clock 232 is increasingly advanced (i.e., made earlier) from the center position until at least one of the bits in the incoming pattern is sampled incorrectly by the sampler 250 resulting in a bit error in the received bit pattern. The clock phase when this bit error first occurs is recorded as a measure of left boundary of the eye. The difference between the left boundary and right boundary of the eye gives the eye width.

If the stopping criterion is not met, $V_{REF}$ 212 is adjusted and step 304 is repeated to determine a new corresponding $C_{DFE}$ 234 that maximizes the first optimization criterion for the adjusted $V_{REF}$ 212. Thus, until the stopping criterion is met, a range of values of $V_{REF}$ 212 are tested and for each $V_{REF}$ 212, a corresponding $C_{DFE}$ 234 is determined to form pair of $V_{REF}$ 212 and $C_{DFE}$ 234 values, and the second parameter (e.g., eye width) is determined for each pair.

The stopping criterion in step 306 may be met when a second optimization criterion (e.g., peak eye width of the sampler input signal 245) is identified from the possible pairs $V_{REF}$ 212 and $C_{DFE}$ 234 values. For example, $V_{REF}$ 212 may be swept across a range of values in a first direction. If the eye width corresponding to the current $V_{REF}$ 212 and corresponding optimum $C_{DFE}$ 234 (i.e., that maximizes the right eye boundary for the current $V_{REF}$ 212) increases as $V_{REF}$ 212 is adjusted in the first direction, then $V_{REF}$ 212 may continue to be adjusted in the first direction until the eye width begins to decrease. The $V_{REF}$ 212 and $C_{DFE}$ 234 at the peak eye width before it begins to decrease may then be stored as the optimal pair. If the eye width instead decreases as $V_{REF}$ 212 is adjusted in the first direction from its initial value, then the direction may be reversed, which will then cause eye width to increase until it reaches a peak eye width.

Once the value of $V_{REF}$ 212 corresponding to the optimized second parameter (e.g., eye width) is found (when applied in combination with a corresponding value of $C_{DFE}$ 234 that achieves the maximum right eye boundary for that value of $V_{REF}$ 212) for the current $C_{BOOST}$ 222, the calibration module 240 sets 308 $V_{REF}$ 212 to the determined value. With $V_{REF}$ 212 now set, the calibration module 240 then calibrates 310 $C_{BOOST}$ 222 and may further adjust $C_{DFE}$ from its initial determined value as described below with respect to FIG. 4.

Figure 4:
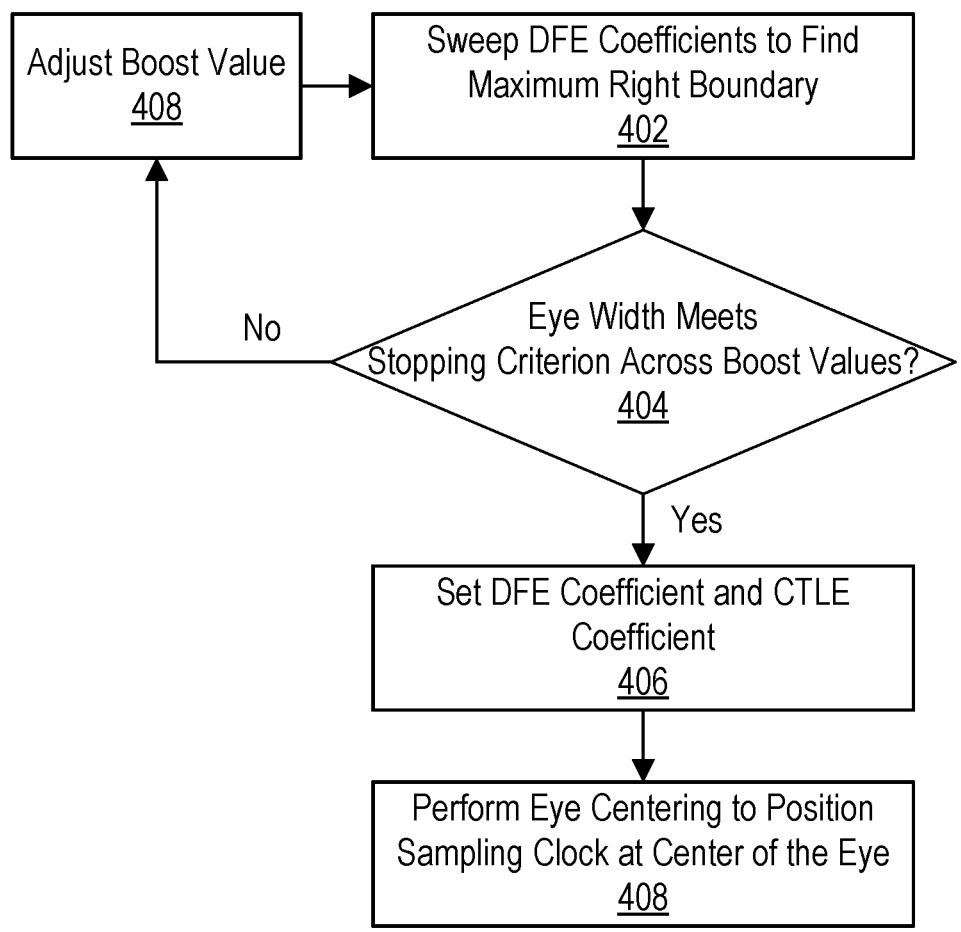
FIG. 4 is a flowchart illustrating an example embodiment of a process for jointly calibrating a first equalizer coefficient and a second equalizer coefficient of a receiver.

As illustrated in the process of FIG. 4, when calibrating 310 $C_{BOOST}$ 222, the calibration module 240 again sweeps 402 $C_{DFE}$ across a range of values (with $V_{REF}$ and $C_{BOOST}$ 222 fixed) until the first optimization criterion is met (e.g., the maximum right eye boundary position is found). For the current $C_{BOOST}$ 222 and corresponding optimal $C_{DFE}$ 234 that meets this first optimization criterion, the calibration module 240 then determines 404 if the second parameter (e.g., eye width) meets 404 a stopping criterion. If the second parameter does not meet the stopping criterion, $C_{BOOST}$ 222 is adjusted (e.g., by incrementing from the current value) and a corresponding $C_{DFE}$ 234 is again determined in step 402 that maximizes the first parameter (e.g., right eye boundary position) for the new $C_{BOOST}$, thus generating additional pairs of $C_{BOOST}$ 222 and corresponding $C_{DFE}$ 234 values.

The stopping criterion may be met in step 404 when the calibration module 240 determines that a second optimization criterion (e.g., peak eye width) is achieved for the possible pairs of $C_{BOOST}$ 222 and corresponding $C_{DFE}$ 234 that meets the first optimization criterion (e.g., peak right eye boundary position). For example, a peak eye width may be identified when the eye width begins to decrease with further increasing values of $C_{BOOST}$ 222. When the peak eye width is found, the values of $C_{BOOST}$ 222 and $C_{DFE}$ 234 corresponding to this peak may be set and stored. In an embodiment, an eye centering may then be performed to position the sampling clock 232 at a center of the eye. The calibration mode may then be exited.

FIG. 5 illustrates an example embodiment of a process for performing a pre-calibration of the receiver 200. Here, $C_{DFE}$ 234 and $C_{BOOST}$ 222 are set 502 to initial values (e.g., $C_{DFE}$=0, $C_{BOOST}$=1). $V_{REF}$ 212 is then set 504 to an initial calibrated value using the eye width of the sampler input signal 245 as a criterion (e.g., by choosing a value that results in a maximum eye width at the sampler input signal 245). For example, in this process, a pre-calibration bit pattern (e.g., a pattern of alternating 1s and 0s such as 101010 . . . ) is transmitted to the receiver 200 and received as the input voltage $V_{IN}$ 205 and $V_{REF}$ 212 is swept across a range of values while measuring the eye width for each value of $V_{REF}$ 212. The reference voltage $V_{REF}$ 212 is then set to the value where the maximum eye width is achieved.

A pre-adaption process is then applied 506 to set the $C_{DFE}$ 234 to a preadapted value suitable to enable a low error rate (e.g., below a predefined threshold error rate) when receiving the pre-calibration bit pattern (e.g., the pattern of alternating 1s and 0s) and with $V_{REF}$ 212 set at its initial calibration value from step 504 and the $C_{BOOST}$ 222 still set to its default value. For example, $C_{DFE}$ 234 may be set to a predefined value or a calibration process may be performed in which $C_{DFE}$ 234 is swept across a range of values until a stopping criterion is met. Here, the stopping criterion may comprise, for example, reaching a minimal error rate.

A levelization process is then performed 508 with the reference voltage $V_{REF}$ 212 set to the initial calibrated value from step 504, $C_{DFE}$ 234 set to the preadapted value from step 506, and the $C_{BOOST}$ 222 still set to the default value. The levelization process detects timing of the a levelization bit pattern and compensates a timing of the output signal $V_{OUT}$ by introducing delays that account for latency between the transmitter and the receiver 200 in order to meet a latency metric.

Here the levelization bit pattern may comprise a first pattern comprising alternating 1s and 0s (e.g., 24 repetitions of the "10" pattern) following by a second pattern of a single value (e.g., 8 "0"s). The first and second patterns may repeat in alternating fashion. The first pattern is utilized to cause the sampler input signal 245 to substantially stabilize and enable robust sampling of the second pattern. Following levelization, the $C_{DFE}$ 234 may be returned 510 back to the default value (e.g., $C_{DFE}$ 234=0) for the calibration process described in FIG. 3.

Figure 6:
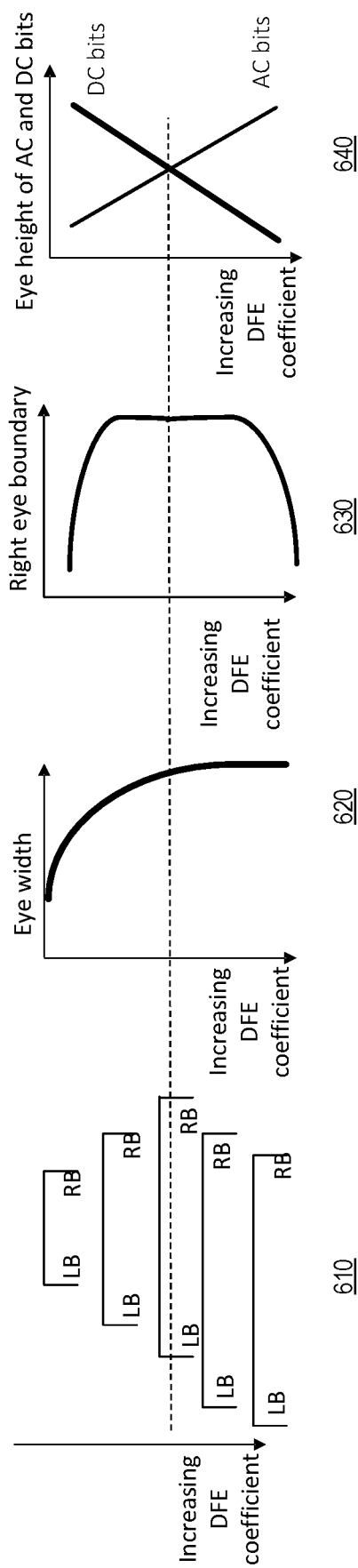
FIG. 6 is a diagram illustrating graphs relevant to calibration parameters utilized to calibrate a receiver.

FIG. 6 includes example graphs illustrating how eye width, right eye boundary, and eye height change with increasing values of $C_{DFE}$ 234 for a static $V_{REF}$ 212 and $C_{BOOST}$ 222. As illustrated in graph 610, as $C_{DFE}$ 234 increases, the left boundary (LB) of the eye diagram tends to occur earlier, while the right boundary (RB) of the eye diagram tends to occur later with increasing $C_{DFE}$ 234 between a minimum value and a peak, and then occurs earlier with increasing $C_{DFE}$ 234 between the peak and the maximum value. The change in right eye boundary position (RB) with respect to $C_{DFE}$ 234 is further illustrated in graph 630. As illustrated in graph 620, the eye width tends to increase with increasing $C_{DFE}$ 234 for low values of $C_{DFE}$ and becomes substantially constant with higher values of $C_{DFE}$. As illustrated in graph 640, the eye height associated with AC bits increases with increasing $C_{DFE}$ 234 while the eye height associated with DC bits decreases with increasing $C_{DFE}$ 234. The peak right eye boundary corresponds approximately to the intersection of the eye height graphs for the AC bits and the DC bits, and thus represents a good metric for calibrating the receiver 200 in a manner that attains a sufficiently high eye width and eye height for different bit patterns.

Figure 7:
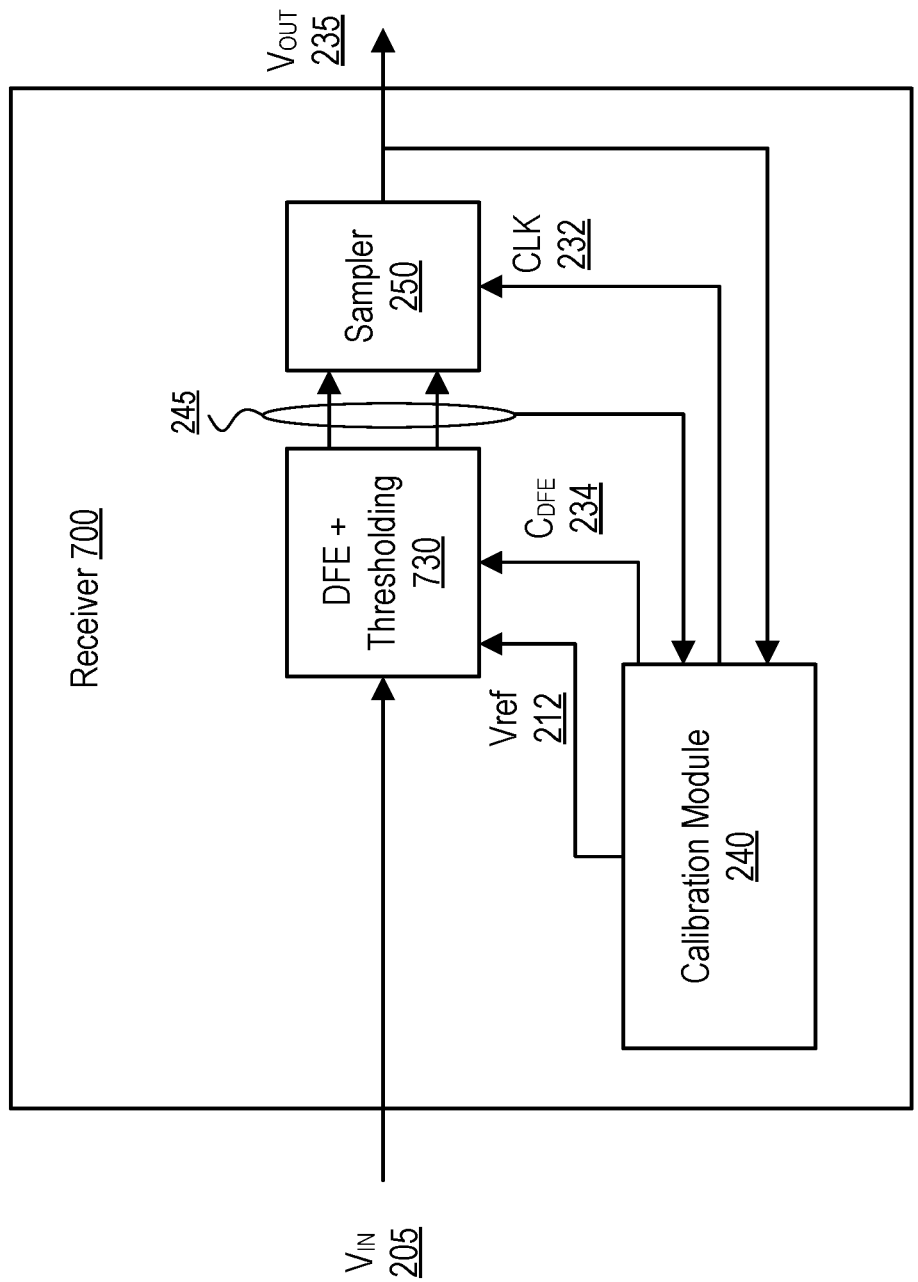
FIG. 7 is a block diagram illustrating a second example embodiment of a receiver.

FIG. 7 illustrates an alternative embodiment of a receiver 700 that may be used as a receiver 120, 160 in place of receiver 200 or as a receiver in a different communication system. The receiver 700 omits the pre-amplifier 210 and the CTLE 220. Instead, the input signal $V_{IN}$ 205 may be inputted directly to a DFE and thresholding circuit 730. The DFE and thresholding circuit 730 receives the reference voltage $V_{REF}$ 212, performs equalization to generate a differential sampler input signal 245 with zero crossings adjusted based on the reference voltage $V_{REF}$ 212, and adjusts the threshold against which the sampler input signal 245 is compared based on $V_{REF}$. The calibration module 240 in the receiver 700 may operate according to the process of steps 302-308 of FIG. 3 described above (omitting step 310) to jointly calibrate $V_{REF}$ and $C_{DFE}$ 234 as previously described. Furthermore, the calibration module 240 of the receiver 700 may similarly perform the steps of FIG. 5 as pre-calibration steps, but may skip setting CTLE coefficients because the CTLE 220 is omitted.

In other alternative embodiments, the receivers 200, 700 may be utilized in communication systems that are not necessarily a memory system. For example, the receivers 200, 700 may be utilized in a high-speed single ended communication system in which a transmitter communicates with a receiver having at least one equalizer.

Upon reading this disclosure, those of ordinary skill in the art will appreciate still alternative structural and functional designs and processes for the described embodiments, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A method for calibrating a receiver of a communication link, the receiver comprising at least a first equalizer to generate a sampler input signal based on a receiver input signal, and a sampler sampling the sampler input signal to generate an output signal, the method comprising:
   receiving, at a receiver over the communication link, a receiver input signal;
   determining, for each of a plurality of reference voltages, a corresponding first equalizer coefficient for the first equalizer and a corresponding plurality of parameters of the sampler input signal that are based on the reference voltage and the corresponding first equalizer coefficient, the corresponding plurality of parameters for each of the plurality of reference voltages including a timing parameter indicative of a timing of when the sampler input signal crosses a threshold where the timing is based on the reference voltage and the corresponding first equalizer coefficient;
   selecting a reference voltage from among the plurality of reference voltages and the selected reference voltage's corresponding first equalizer coefficient that have the corresponding plurality of parameters of the sampler input signal that satisfy a plurality of optimization criterion, the selected reference voltage and the corresponding first equalizer coefficient of the selected reference voltage having a timing parameter that satisfies a timing criterion included in the plurality of optimization criterion; and
   setting the selected reference voltage.

2. The method of claim 1, wherein the receiver input signal comprises a bit pattern having alternating current frequency components and direct current frequency components.

3. The method of claim 1, wherein selecting from among the plurality of reference voltages and the selected reference voltage's corresponding first equalizer coefficient that have the corresponding plurality of parameters of the sampler input signal that satisfy the plurality of optimization criterion comprises:
   determining, for each of the plurality of reference voltages and its corresponding first equalizer coefficient, whether a first parameter of the sampler input signal satisfies a first optimization criterion that is based on timings of when the sampler input signal crosses the threshold, and whether a second a parameter of the sampler input signal that satisfies a second optimization criterion;
   wherein the reference voltage that is selected satisfies both the first optimization criterion and the second optimization criterion.

4. The method of claim 3, wherein the first parameter comprises a right eye boundary of an eye diagram of the sampler input signal, and the first optimization criterion comprises maximization of the right eye boundary position.

5. The method of claim 3, wherein the second parameter comprises an eye width of an eye diagram of the sampler input signal, and the second optimization criterion comprises maximization of the eye width.

6. The method of claim 3, wherein the first equalizer comprises a decision feedback equalizer and wherein the first equalizer coefficient comprises a decision feedback equalization coefficient of the decision feedback equalizer.

7. The method of claim 3, wherein the receiver further comprises a second equalizer to generate a first equalizer input signal to the first equalizer based on the receiver input signal, the method further comprising:
   determining, for each of a plurality of second equalizer coefficients of the second equalizer, a corresponding adjusted first equalizer coefficient for the first equalizer that causes the first parameter of the sampler input signal to achieve the first optimization criterion;
   selecting a selected second equalizer coefficient from among the plurality of second equalizer coefficients that when applied in combination with the corresponding adjusted first equalizer coefficient associated with the selected second equalizer coefficient and the selected reference voltage, causes the second parameter of the sampler input signal to achieve the second optimization criterion; and
   configuring the second equalizer with the selected second equalizer coefficient and configuring the first equalizer with the corresponding adjusted first equalizer coefficient.

8. The method of claim 7, wherein the second equalizer comprises a continuous time linear equalizer and wherein the second equalizer coefficient comprises a boost parameter of the continuous time linear equalizer.

9. The method of claim 1, further comprising:
receiving, by a pre-amplifier, the receiver input signal and amplifying the receiving input signal based on the reference voltage to generate a first equalizer input signal to the first equalizer.

10. The method of claim 1, wherein the reference voltage controls an operation of the sampler.

11. A receiver comprising:
an input terminal to receive a receiver input signal over communication link;
a first equalizer to equalize a first equalizer input signal derived from the receiver input signal, the first equalizer applying equalization based on a first equalizer coefficient to generate a sampler input signal;
a sampler to sample the sampler input signal to generate an output signal; and
a calibration module to:
determine, for each of a plurality of reference voltages, a corresponding first equalizer coefficient for the first equalizer and a corresponding plurality of parameters of the sampler input signal that are based on the reference voltage and the corresponding first equalizer coefficient, the corresponding plurality of parameters for each of the plurality of reference voltages including a timing parameter indicative of a timing of when the sampler input signal crosses a threshold where the timing is based on the reference voltage and the corresponding first equalizer coefficient;
select a reference voltage from among the plurality of reference voltages and the selected reference voltage's corresponding first equalizer coefficient that have the corresponding plurality of parameters of the sampler input signal that satisfy a plurality of optimization criterion, the selected reference voltage and the corresponding first equalizer coefficient of the selected reference voltage having a timing parameter that satisfies a timing criterion included in the plurality of optimization criterion; and
set the selected reference voltage.

12. The receiver of claim 11, wherein the receiver input signal comprises a bit pattern having alternating current frequency components and direct current frequency components.

13. The receiver of claim 11, wherein the calibration module is configured to select the reference voltage by determining, for each of the plurality of reference voltages and its corresponding first equalizer coefficient, whether a first parameter of the sampler input signal satisfies a first optimization criterion that is based on timings of when the sampler input signal crosses the threshold, and whether a second a parameter of the sampler input signal that satisfies a second optimization criterion;
wherein the reference voltage that is selected satisfies both the first optimization criterion and the second optimization criterion.

14. The receiver of claim 13, wherein the first parameter comprises a right eye boundary of an eye diagram of the sampler input signal, and the first optimization criterion comprises maximization of the right eye boundary position.

15. The receiver of claim 13, wherein the second parameter comprises an eye width of an eye diagram of the sampler input signal, and the second optimization criterion comprises maximization of the eye width.

16. The receiver of claim 13, wherein the first equalizer comprises a decision feedback equalizer and wherein the first equalizer coefficient comprises a decision feedback equalization coefficient of the decision feedback equalizer.

17. The receiver of claim 13, wherein the receiver further comprises a second equalizer to generate a first equalizer input signal to the first equalizer based on the receiver input signal, the calibration module is further configured to:
determine, for each of a plurality of second equalizer coefficients of the second equalizer, a corresponding adjusted first equalizer coefficient for the first equalizer that causes the first parameter of the sampler input signal to achieve the first optimization criterion;
select a selected second equalizer coefficient from among the plurality of second equalizer coefficients that when applied in combination with the corresponding adjusted first equalizer coefficient associated with the selected second equalizer coefficient and the selected reference voltage, causes the second parameter of the sampler input signal to achieve the second optimization criterion; and
configure the second equalizer with the selected second equalizer coefficient and configuring the first equalizer with the corresponding adjusted first equalizer coefficient.

18. The receiver of claim 17, wherein the second equalizer comprises a continuous time linear equalizer and wherein the second equalizer coefficient comprises a boost parameter of the continuous time linear equalizer.

19. The receiver of claim 11, further comprising:
a pre-amplifier configured to receive the receiver input signal and amplify the receiver input signal based on the reference voltage to generate a first equalizer input signal to the first equalizer.

20. A memory device comprising:
a memory core to store input data in response to a write command and to read output data in response to a read command;
an input/output device comprising a transmitter to transmit an output signal corresponding to at least a portion of the output data over a communication link, and a receiver to receive a receiver input signal corresponding to at least a portion of the input data over the communication link, the receiver comprising:
an input terminal to receive the receiver input signal over the communication link;
a first equalizer to equalize a first equalizer input signal derived from the receiver input signal, the first equalizer to apply equalization based on a first equalizer coefficient to generate a sampler input signal;
a sampler to sample the sampler input signal to generate a receiver output signal; and
a calibration module to:
determine, for each of a plurality of reference voltages, a corresponding first equalizer coefficient for the first equalizer and a corresponding plurality of parameters of the sampler input signal that are based on the reference voltage and the corresponding first equalizer coefficient, the corresponding plurality of parameters for each of the plurality of reference voltages including a timing parameter indicative of a timing of when the sampler input signal crosses a threshold where the timing is based on the reference voltage and the corresponding first equalizer coefficient;
select a reference voltage from among the plurality of reference voltages and the selected reference voltage's corresponding first equalizer coefficient that have the corresponding plurality of parameters of the sampler input signal that satisfy a plurality of optimization criterion, the selected reference voltage and the corresponding first equalizer coefficient of the selected reference voltage having a timing parameter that satisfies a timing criterion included in the plurality of optimization criterion; and
set the selected reference voltage.

* * * * *